US008836249B2

(12) United States Patent
Bertozzi et al.

(10) Patent No.: US 8,836,249 B2

(45) Date of Patent: Sep. 16, 2014

(54) METHODS AND SYSTEMS FOR CONFINING CHARGED PARTICLES TO A COMPACT ORBIT DURING ACCELERATION USING A NON-SCALING FIXED FIELD ALTERNATING GRADIENT MAGNETIC FIELD

(75) Inventors: William Bertozzi, Lexington, MA (US); Wilbur Franklin, Londonderry, NH (US); Carol Johnstone, Warrenville, IL (US); Robert J. Ledoux, Harvard, MA (US)

(73) Assignee: Passport Systems, Inc., Billerica, MA (US)

( * ) Notice: Subject to any disclaimer, the term of this patent is extended or adjusted under 35 U.S.C. 154(b) by 277 days.

(21) Appl. No.: 13/034,931

(22) Filed: Feb. 25, 2011

(65) Prior Publication Data

US 2012/0013274 A1 Jan. 19, 2012

Related U.S. Application Data

(60) Provisional application No. 61/308,142, filed on Feb. 25, 2010.

(51) Int. Cl.

| | |
|---|---|
| ***H05H 11/00*** | (2006.01) |
| ***G06F 17/50*** | (2006.01) |
| ***G06F 17/10*** | (2006.01) |
| ***H05H 13/08*** | (2006.01) |

(52) U.S. Cl.

CPC .................................... *H05H 13/08* (2013.01)
USPC ................ 315/504; 315/500; 315/501; 703/2

(58) Field of Classification Search

CPC .......... H05H 11/00; G06F 17/50; G06F 17/10
USPC .............................. 315/500, 501, 504; 703/2
See application file for complete search history.

(56) References Cited

U.S. PATENT DOCUMENTS

| | | | | |
|---|---|---|---|---|
| 2,890,348 | A * | 6/1959 | Ohkawa | 250/285 |
| 2,932,797 | A * | 4/1960 | Symon | 315/500 |
| 2007/0273383 | A1* | 11/2007 | Johnstone | 324/463 |
| 2009/0091274 | A1* | 4/2009 | Bertozzi et al. | 315/504 |

OTHER PUBLICATIONS

Ruggiero, Brief History of FFAG Accelerators, Mar. 2006, FFAG '05, Brookhaven National Laboratory, pp. 1-7.*

Pasternak, Proton Acceleration Using FFAGs, FFAG '08, IC London/ RAL, pp. 1-20.*

Craddock at al.,"Cyclotrons and fixed-field alternating-gradient accelerators", Reviews of Accelerator Science and Technology 1.01, 2008, pp. 65-97.*

(Continued)

*Primary Examiner* — Alexander H Taningco
*Assistant Examiner* — David Lotter

(74) *Attorney, Agent, or Firm* — Stephen B. Deustch; Peter K. Sollins; Foley Hoag LLP

(57) ABSTRACT

A method is described wherein a beam of charged particles is confined to an orbit within a compact region of space as it is accelerated across a wide range of energies. This confinement is achieved using a non-scaling magnetic field based on the Fixed Alternating Gradient principle where the field strength includes non-linear components. Examples of magnet configurations designed using this method are disclosed.

4 Claims, 4 Drawing Sheets

Induction Core

(56) References Cited

OTHER PUBLICATIONS

Johnstone et al, Linear Non-scaling FFAGs for Rapid Acceleration using High-frequency RF, NuFact04, 2004, Osaka University.*

Edgecock, at al, "EMMA—The World's First Non-Scaling FFAG", EPAC08, Proceedings of EPAC08, Genoa, Italy, pp. 3380-3382.*

G.H. Rees, "Non-isochronous and Isochronous, Non-scaling, FFAG Designs", ASTeC, RAL, U.K.*

G.H. Rees, "Non-isochronous and Isochronous, Non-scaling, FFAG Designs", Cyclotrons and Their Applications 2007, 18th International Conference, pp. 189-192.*

Craddock et al. "Cyclotrons and fixed-field alternating-gradient accelerators", TRI-PP-08-24, dated Oct. 2008.

Symon et al. "Fixed-Field Alternating-Gradient Particle Accelerators", Physical Review, vol. 103, No. 6, Sep. 15, 1956.

Barlow et al. "The Non Scaling Fixed Field Alternating Gradient (NS-FFAG) Accelerator", Engineering and Physical Sciences Research Council, EP/E032869/1, Nov. 19, 2010.

Sheehy et al. "Fixed field alternating gradient accelerator with small orbit shift and tune excursion", Physical Review Special Topics—Accelerators and Beams, vol. 13, issue 4, Apr. 22, 2010.

International Search Report and Written Opinion for PCT/US 11/26240.

* cited by examiner

METHODS AND SYSTEMS FOR CONFINING CHARGED PARTICLES TO A COMPACT ORBIT DURING ACCELERATION USING A NON-SCALING FIXED FIELD ALTERNATING GRADIENT MAGNETIC FIELD

CROSS-REFERENCE TO RELATED APPLICATIONS

This present application claims priority to and the benefit of U.S. Provisional Patent Application Ser. No. 61/308,142 entitled “Methods And Systems For Confining Charged Particles To A Compact Orbit During Acceleration Using A Non-Scaling Fixed Field Alternating Gradient Magnetic Field” which was filed on Feb. 25, 2010 by William Bertozzi, Wilbur Franklin, Carol Johnstone and Robert J. Ledoux, and which is hereby incorporated by reference.

FIELD OF THE INVENTION

This application relates to the design of particle accelerators, and in particular to non-scaling fixed field alternating gradient machines in which charged particles are confined to compact orbits while being accelerated to a desired energy.

BACKGROUND

Particle accelerators can be generally grouped into two basic categories: accelerators which recirculate particles and those which accelerate particles in a line. The latter (linacs) require transverse magnetic fields only to focus or form a beam with finite spatial extent; the net transverse magnetic field at the center of the beam is zero. The first category, however, necessitates the use of a system of guide magnets to confine the beam in a circular or spiral orbit during acceleration. This magnetic field can take many different forms. For example, in the case of a synchrotron, the magnetic field is varied with time to keep charged particles confined to a closed orbit which lies within a very limited radial range as the particles accelerate and gain energy; the beam orbit experiences no or little change in radius with energy. Synchrotrons have small magnetic component apertures which accommodate the transverse size of the circulating beam but the magnetic field must be ramped, or pulsed, in synch with the beam energy. Synchrotrons therefore have limited duty cycle due to the time required to pulse and recycle a magnetic field. A betatron behaves in a similar fashion, requiring the guide field to vary with energy.

In a recirculating accelerator with fixed magnetic fields, no such cycling is necessary, but the position of the particle beam changes as it gains energy. Stable orbits require the integrated magnetic strength to scale with the momentum of the particles, and to accurately track the position of the particle beam as it moves outward across the magnetic aperture during acceleration. In the case of some cyclotrons, the magnet field is very nearly uniform in space and time and particles move into larger orbits as their energies rise, with a correspondingly longer path length in the field (and therefore increased integrated field strength as a function of energy). In the case of a fixed field alternating gradient (FFAG) accelerator, the magnetic field strength at a given point in space does not vary with time, but its spatial variation with radius can be large in order to match the increasing momentum of the particles as they gain energy and their orbits change accordingly; that is, in order to limit the required increase in orbit radius, the magnetic field can increase sharply as a function of radius.

The use of a field profile with strong spatial variation can permit particles of very different energies to coexist in close and pre-determined proximity. For applications requiring acceleration of intense beams within a compact space, this is a desirable property. There are many situations where a small footprint or compact size is desirable or necessary because of limitations in space and/or requirements of portability. A small footprint can also be important to achieve high duty cycle and consequently increased beam intensity with a modest acceleration system. As a result, accelerators using the FFAG principle for the guide magnets have attracted particular attention in commercial and research applications requiring high beam power, high duty cycle, reliability, and precisely controlled beams at reasonable cost. See C. Prior, Editor, ICFA Beam Dynamics Newsletter #43, August 2007, http://www-bd-fnal.gov\icfabd\Newsletter43.pdf; M. K. Craddock, “New Concepts in FFAG Design for Secondary Beam Facilities and Other Applications”, PAC’05, Knoxville, Tenn., USA, 16-20 May 2005, p. 261; Machida, http://hadron.kek.jp/~machida/mirror/misl/publications20090415.pdf; RACCAM project, http://lpsc.in2p3.fr/service_accelerateurs/raccam.htm; E. Keil, http://keil.home.cern.ch/keil/keil.bib; CONFORM project, U.K. (EMMA and PAMELA), http://www.conform.ac.uk; Proceedings of International Workshops on FFAG Accelerators (FFAG00-FFAG08).

FFAG magnet systems and the resulting accelerators can be divided into scaling and non-scaling types. Scaling FFAGs are characterized by geometrically similar orbits of increasing radius. The magnetic field, both in radial sector designs (Keith R. Symon, A Strong Focussing Accelerator with a DC Ring Magnet, MURA Notes, Aug. 13, 1954; and D. W. Kerst, K. R. Symon, L. J. Laslett, L. W. Jones, and K. M. Terwilliger, “Fixed field alternating particle accelerators”, CERN Symposium Proceedings, v. 1, 1956, p. 366) and in spiral sector designs (D. W. Kerst, “Properties of an Intersecting-Beam Accelerating System”, CERN Symposium Proceedings, v. 1, 1956, pp. 36-39), follows the laws $$B \propto r^k F(\theta),$$

$$B \propto r^k G(\Psi)$$

where r is the radius and k, the constant field index, is the “scaling” attribute. F(θ) and G(Ψ) are dependent on the chosen design. (In the spiral ridge design, the parameter Ψ is related to the physical angle, θ, in a well understood manner related to design details.) Scaling machines are theoretically designed such that at all energies during the acceleration cycle the particle beam executes a fixed number of betatron oscillations about a reference orbit in the course of a revolution. This condition, referred to as constant betatron tune, helps to insure that the beam can be accelerated without encountering the strong low-order resonances which lead to beam blow-up and eventual loss from particles hitting accelerator walls. Scaling FFAG accelerators directly incorporate high-order multipole fields to achieve this constant tune and, in general, require complex magnet shapes, pole profiles and, in the case of the spiral sector design, elaborate edge shaping.

The non-scaling FFAG was originally conceived as a means for the rapid acceleration of muon beams. This type of design did not attempt to achieve a constant betatron tune, employed only a linear radial dependence for the magnetic field strength (thereby achieving a large dynamic aperture) and aimed for beam stability only during a brief acceleration cycle lasting for tens of orbits and spanning a limited energy range. These muon or rapid acceleration designs utilized rectangular, fixed-field magnets that combined steering and transverse focusing only linear (quadrupole) gradients to monotonically increase the field with radius. However, the non-uniform, energy-dependent betatron tunes resulted in the beam crossing many resonances, thus making this approach untenable for gradual acceleration which requires beam stability over a much larger number of turns.

An innovative non-scaling approach to gradual acceleration was subsequently proposed in which the constant tune feature was successfully combined with the simplicity of linear-field, non-scaling FFAG components. (See US Published Patent Application 2007/0273383, "Tune-stabilized, non-scaling, fixed-field, alternating gradient accelerator", Johnstone, Carol J.) This non-scaling approach is termed a linear-field, linear-edge FFAG; in it, weak and strong focusing principles (both edge and linear-gradient focusing) are applied to fixed-field combined-function magnets, but now with canted entrance and exit faces, so as to stabilize machine tunes. This stabilization occurs though an appropriate increase in the net or integrated field with radius. However, this linear-field non-scaling FFAG remains limited in terms of machine design and features. Generation of stable tunes requires either the use of large component apertures incompatible with a compact system, or the imposition of a restricted acceleration range. While momentum gains of at approximately 600% have been achieved with this type of design, the approach fails to provide the compactness and expanded tune stability needed for applications requiring larger momentum gains with modest acceleration per turn.

DETAILED DESCRIPTION OF EMBODIMENTS

Figure 1A:
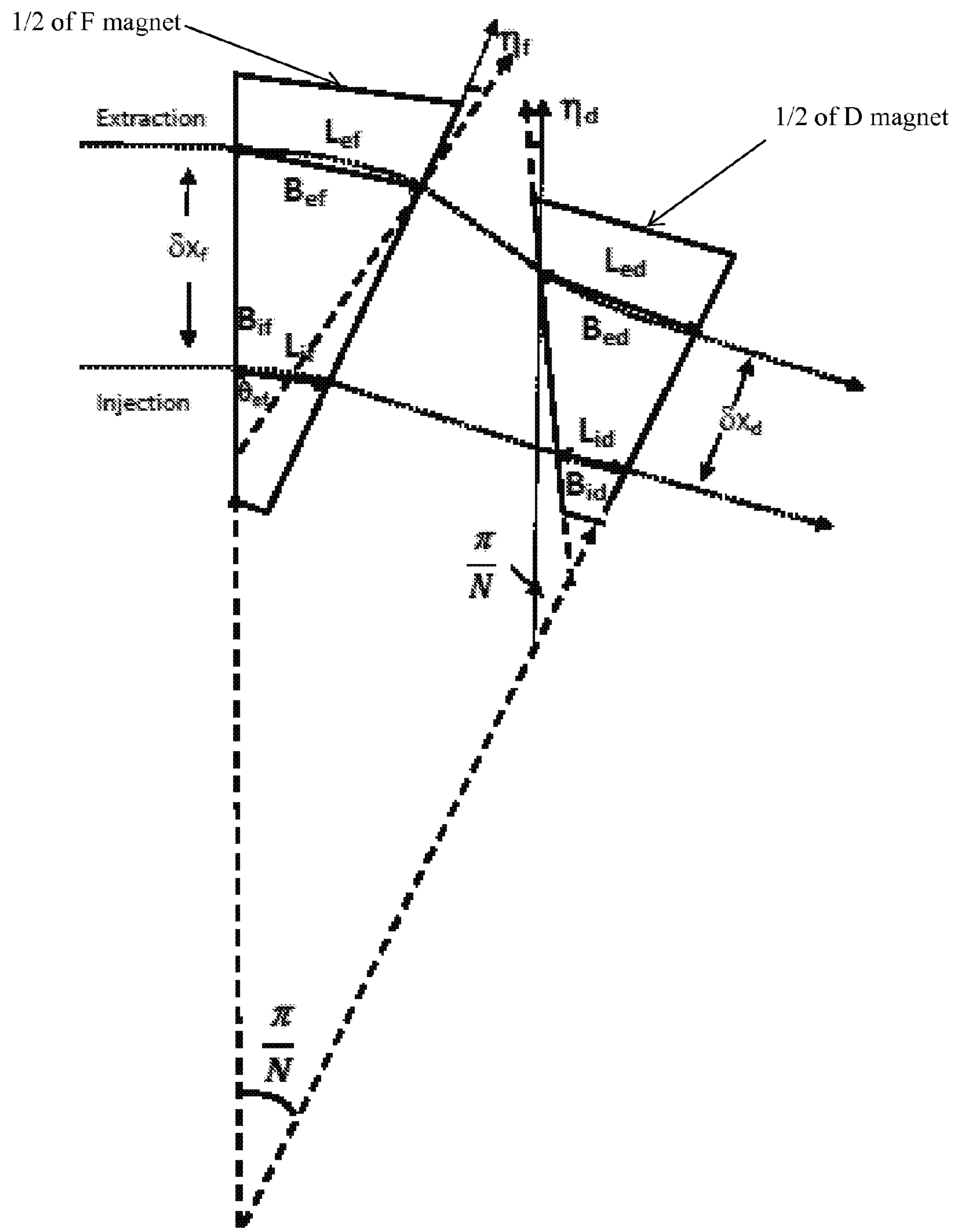
FIG. 1A shows the layout and certain of the parameters of half of a standard unit cell of a pair of FFAG magnets. The figure consists of half of a horizontally focusing (F) magnet on the left and half of a horizontally defocusing (D) magnet on the right. Because the figure displays half of each magnet, it is reflected at either end to produce the full-cell unit.

In this disclosure we introduce FFAG designs that achieve compactness within the context of the non-scaling approach by removing the linear-field condition, as well as a method for designing such accelerators. The guide field magnets in these new designs retain the simple wedge shapes, but nonlinear field components are systematically introduced to realize more advanced machine properties and more desirable designs than can be realized with linear fields. The type and magnitude of the nonlinear field content remain dependent on machine geometry, energy reach, and application.

The embodiments described herein are exemplary of possible applications of the technology disclosed herein for accelerating charged particle beams. Those experienced in the art will recognize that there are extensions, modifications and other arrangements of the important elements disclosed that can be implemented and they are included as part of this disclosure.

As examples of accelerators designed by the methods disclosed herein, we present four basic designs:

a) an electron accelerator from kinetic energy of 50 keV to 3 MeV, representing a momentum gain of 1500%;

b) a 3.5 MeV ultra-compact version which has a significantly reduced footprint relative to the first machine;

c) a 4 MeV ultra-compact version which also has a significantly reduced footprint relative to the first machine; and d) a more advanced version with an enhanced acceleration cycle from kinetic energy of 50 keV to 9 MeV, representing a momentum gain of more than 4000%.

These designs demonstrate the nature of the field behavior required to construct a non-scaling FFAG accommodating a momentum range as large as a factor of 41 between injection and extraction (a kinetic energy range as large as a factor of 180), within a restricted size, that can be physically realized with good magnet design using familiar components while employing minimal non-linear dynamics and field patterns.

In an induction machine the smallest inner dimensions are set mostly by the area of the induction core that achieves the necessary flux change to achieve the required momentum/energy gain (and as large as possible duty cycle) with minimal power consumption. The extraction radius is established by the desire to minimize the size of the machine (and also maximize the duty cycle) using the magnetic materials at hand. As noted above, the linear field non-scaling design cannot achieve these combined goals for an extraction kinetic energy between 3 and 9 MeV; the first and fourth designs presented herein demonstrate the achievement of these energies. In the second and third designs, the induction core is reduced in size compared to the first design to accommodate the reduced radii. Energies of 3.5 and 4 MeV are possible at differing duty cycles. The minimum required area of an induction core is determined by the energy to be gained by the acceleration. Induction core areas larger than this minimum permit larger duty cycles up to a maximum of 50%.

Reduction in the size of the induction core allows a reduction in both injection radius and extraction radius. Again, the linear design cannot achieve these combined goals.

In the design method disclosed herein, which was used to develop the specific accelerator designs also disclosed, the magnetic field expansion, and in particular the nonlinear content thereof, is ultimately the product of an optimization search to best fit specific design criteria. The optimized 3-MeV design exhibits significantly lower-order multipole magnetic field content than the 9-MeV design (or, alternatively, greater tune stability for the same multipole content). The 3-MeV design has an average injection radius of 20 cm and an average extraction radius of 42 cm. In the 9 MeV machine, the injection radius was similarly constrained to be less than 24 cm and the extraction radius less than 44 cm. (In the 9 MeV machine design, the average radius of the 3 MeV orbit is about 34 cm due to the more rapid field increase as a function of radius as compared to the 3 MeV machine design.)

Acceleration to other energies with comparable momentum/energy gain, optionally with other differing design features as well, is an obvious extension of the concepts and design methods herein described. The reduced-induction-core-size 3.5 and 4 MeV machines are two such examples, wherein other dimensions and parameters are optimized to take advantage of the reduced core size to reduce overall footprint and increase duty cycle. For the machines described here, the magnets are practical to manufacture with field strengths and profiles that allow construction with either electromagnets, or permanent magnetic materials.

Figure 1B:
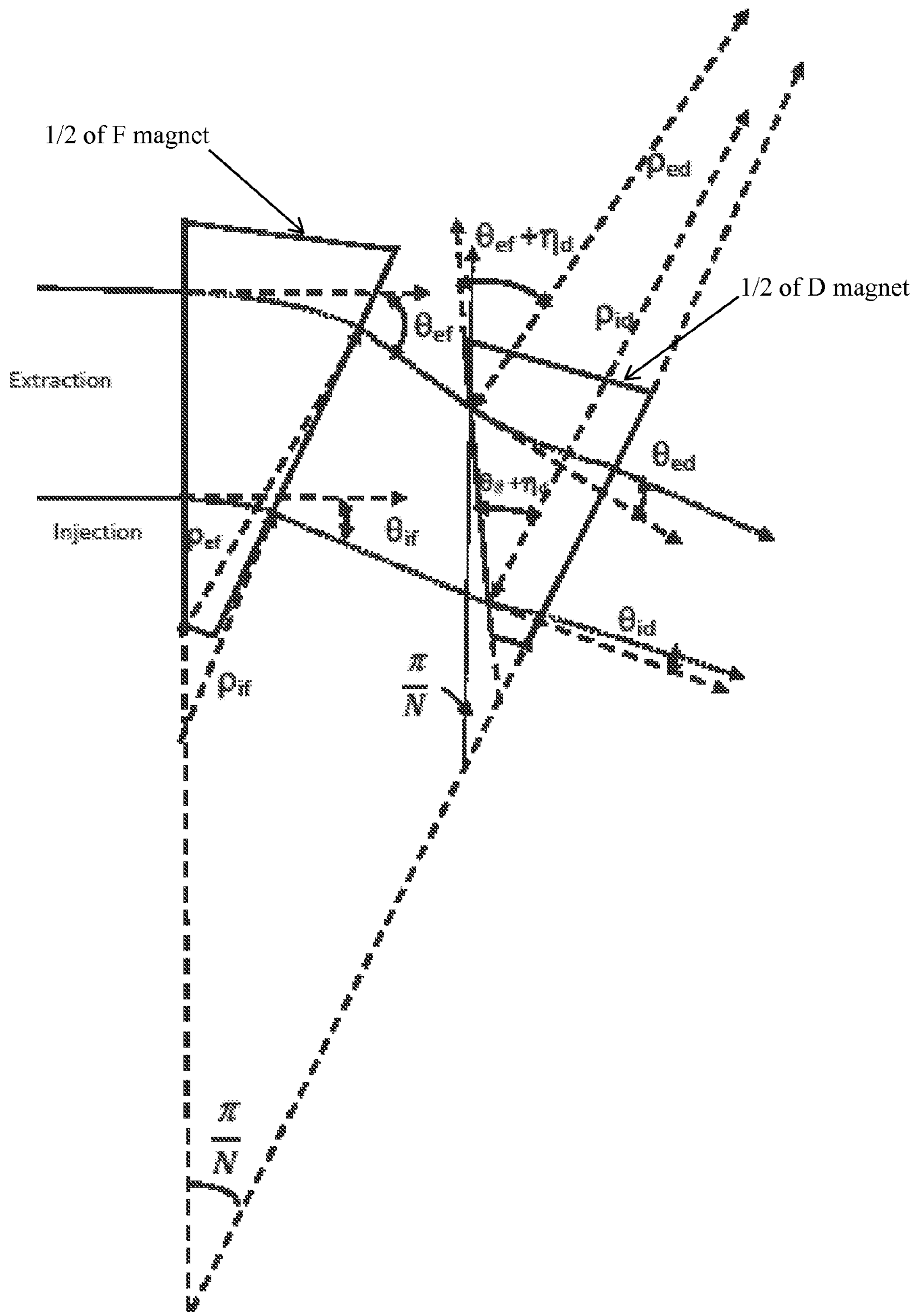
FIG. 1B shows the layout and certain other parameters of the half of a standard unit cell of FFAG magnets shown in FIG. 1A.
Figure 2:
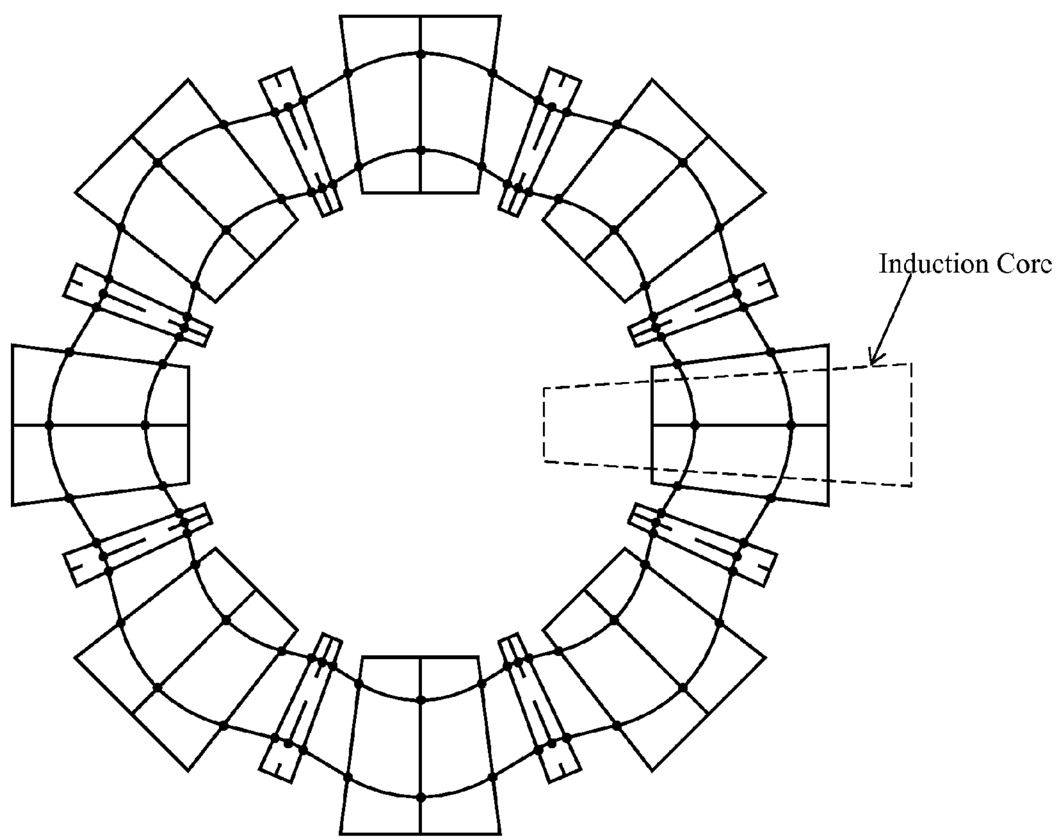
FIG. 2 shows an entire FFAG magnet system as constructed from eight identical unit cells as in FIGS. 1A and 1B to form a recirculating ring layout for a 3-MeV machine. (The number of cells can vary depending on energy, ring size, and magnet aperture.) The location of the induction core is shown schematically; its specific location with respect to the focusing and defocussing magnets in any concrete design may vary depending on practical design considerations.
Figure 3:
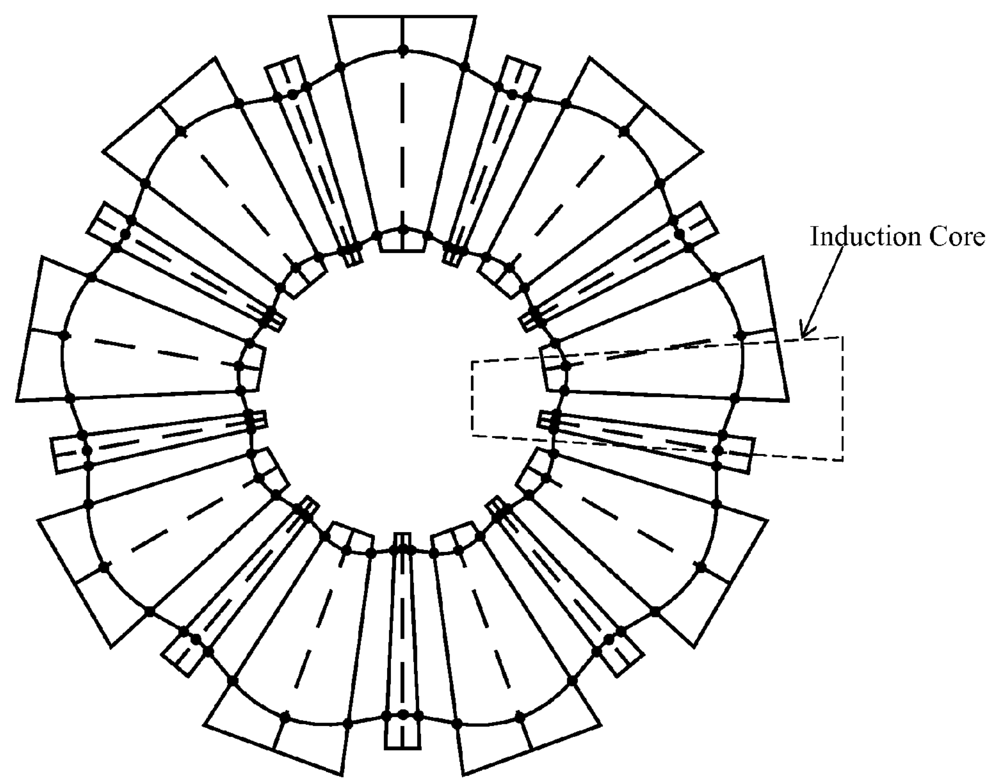
FIG. 3 shows the full ring layout of a 9-MeV compact electron accelerator constructed from the unit cells of FIGS. 1A and 1B. The 9-MeV design requires nine full cells instead of the eight characteristic of lower energy machines. The location of the induction core is shown schematically; its specific location with respect to the focusing and defocussing magnets in any concrete design may vary depending on practical design considerations.

As set forth above, the initial approach to tune stabilization in a linear-field non-scaling FFAG was developed by C. Johnstone. (See US Published Patent Application 2007/0273383, "Tune-stabilized, non-scaling, fixed-field, alternating gradient accelerator", Johnstone, Carol J.; C. Johnstone, et. al., "Non-scaling FFAG Variants for HEP and Medical Applications," to be published in Proceedings of the 2009 Particle Accelerator Conference, Vancouver, Calif., May 4-8, 2009; C. Johnstone, et. al., "A New Nonscaling FFAG for Medical Applications," ICFA Beam Dynamics Newsletter No. 43, July, 2007, http://www-bd.fnal.gov/icfabd/Newsletter43. pdf, pp. 125-132; C. Johnstone, et. al., "New Nonscaling FFAG for Medical Applications," Proceedings of the 2007 Particle Accelerator Conference, Albuquerque, N. Mex., Jun. 25-29, 2007, pp. 2951; C. Johnstone, et. al., "Tune-stabilized Linear Field FFAG for Carbon Therapy", Proceedings of the 2006 European Particle Accelerator Conference, Edinburgh, UK, Jun. 26-30, 2006, pp. 2290-2292) Her approach involved the use of an analytical model which is also a starting point for the methods and designs described herein. In that model, the magnet system is divided into a set of identical cells, as shown in FIGS. 1A and 1B. FIGS. 2 and 3 show exemplary complete ring layouts based upon such cells. Each individual cell in the rings in FIGS. 2 and 3 consists of two steering magnets with shaped edges, that also provide transverse envelope control, namely an F-magnet for focusing the beam horizontally while defocusing it vertically, and a D-magnet which defocuses the beam horizontally and focuses it vertically, as shown in FIGS. 1A and 1B.

Since the ring is entirely repetitive, it can be described dynamically by the properties of its constituent cells.

The following is a list of relevant terms and parameters for the ring magnets:

$P_{extract}$ Extraction momentum [MeV/c];
$P_{inject}$ Injection momentum [MeV/c];
$\rho_{ef}$ Radius of trajectory in F magnet at extraction [m];
$\rho_{ed}$ Radius of trajectory in D magnet at extraction [m];
$\rho_{if}$ Radius of trajectory in F magnet at injection [m];
$\rho_{id}$ Radius of trajectory in D magnet at injection [m];
$\eta_{if}$ Edge angle of F magnet at injection [rad];
$\eta_{ef}$ Edge angle of F magnet at extraction [rad];

As currently modeled, $\eta_{ef}=\eta_{if}=\eta_f$, the edge angle relative to the sector angle at extraction as shown in FIG. 1A.

$\eta_{id}$ Edge angle of D magnet at injection [rad];
$\eta_{ed}$ Edge angle of D magnet at extraction [rad];

As currently modeled and as in the F magnet, both of these edge angles are set to be equal. However, these angles for the D magnet are defined differently as shown in FIG. 1A. This edge angle is defined relative to the line through the center of the F magnet.

$D_e$ Drift length between F and D magnets at extraction [m];
$D_i$ Drift length between F and D magnets at injection [m];
$L_{ef}$ Trajectory length in half of the F magnet at extraction [m];
$L_{if}$ Trajectory length in half of the F magnet at injection [m];
$L_{ed}$ Trajectory length in half of the D magnet at extraction [m];
$L_{id}$ Trajectory length in half of the D magnet at injection [m];
$\delta x_{if}$ Distance from injection orbit to extraction orbit, center of F magnet [m];
$\delta x_{id}$ Distance from injection orbit to extraction orbit, center of D magnet [m];
$\theta_{ef}$ Angle of trajectory in half F magnet at extraction [rad];
$\theta_{ed}$ Angle of trajectory in half D magnet at extraction [rad];
$\theta_{if}$ Angle of trajectory in half F magnet at injection [rad];
$\theta_{id}$ Angle of trajectory in half D magnet at injection [rad];
$k_{ef}=30\,B'_{ef}/P_{extract}$ Normalized focusing strength of F magnet at extraction $[m^{-2}]$ (defined in terms of the local field derivative);
$k_{ed}=30\,B'_{ed}/P_{extract}$ Normalized focusing strength of D magnet at extraction $[m^{-2}]$ (defined in terms of local field derivative);
$k_{if}=30\,B'_{if}/P_{inject}$ Normalized focusing strength of F magnet at injection $[m^{-2}]$ (defined in terms of local field derivative);
$k_{id}=30\,B'_{id}/P_{inject}$ Normalized focusing strength of D magnet at injection $[m^{-2}]$ (defined in terms of local field derivative);
$L_{ehalf}=L_{ef}+L_{ed}+D_e$ Half-cell trajectory length at extraction [m]; and
$L_{ihalf}=L_{if}+L_{id}+D_i$ Half-cell trajectory length at injection [m].

The following identities may be used to relate these variables to basic machine parameters that in turn may be used in equations:

1) $\theta_{ef}=L_{ef}/\rho_{ef}$
2) $\theta_{ed}=L_{ed}/\rho_{ed}$
3) $\theta_{if}=L_{if}/\rho_{if}$
4) $\theta_{id}=L_{id}/\rho_{id}$
5) $\rho_{ef}=P_{extract}/30B_{ef}$
6) $\rho_{ed}=P_{extract}/30B_{ed}$
7) $\rho_{if}=P_{extract}/30B_{if}$
8) $\rho_{id}=P_{extract}/30B_{id}$
9) Magnetic field expansion at extraction in F magnet:
$$B_{ef}=B_{0f}+a_f\delta x_{ef}+b_f\delta x_{ef}^2+c_f\delta x_{ef}^3+d_f\delta x_{ef}^4+e_f\delta x_{ef}^5+f_f\delta x_{ef}^6$$
10) Magnetic field expansion at extraction in D magnet:
$$B_{ed}=B_{0d}+a_d\delta x_{ed}+b_d\delta x_{ed}^2+c_d\delta x_{ed}^3+d_d\delta x_{ed}^4+e_d\delta x_{ed}^5+f_d\delta x_{ed}^6$$
11) Magnetic field expansion at injection in F magnet:
$$B_{if}=B_{0f}+a_f(\delta x_{ef}-\delta x_{if})+b_f(\delta x_{ef}-\delta x_{if})^2+C_f(\delta x_{ef}-\delta x_{if})^3++d_f(\delta x_{ef}-\delta x_{if})^4+e_f(\delta x_{ef}-\delta x_{if})^5+f_f(\delta x_{ef}-\delta x_{if})^6$$
12) Magnetic field expansion at injection in D magnet:
$$B_{id}=B_{0d}+a_d(\delta x_{ed}-\delta x_{id})+b_d(\delta x_{ed}-\delta x_{id})^2+C_d(\delta x_{ed}-\delta x_{id})^3++d_d(\delta x_{ed}-\delta x_{id})^4+e_d(\delta x_{ed}-\delta x_{id})^5+f_f(\delta x_{ed}-\delta x_{id})^6$$

Note that fields are expressed in kG and that the field expansion is in variables relative to the extraction orbit—for example, $\delta x_{if}$ is the distance from injection to extraction in the F magnet so that the increasing values for the field correspond to increasing values of radius. The value $\delta x_{id}$ is the distance from where the field has a value $B_{0f}$ to the extraction orbit. The point in radius where the field has the value $B_{0f}$ is the position about which the field expansion is made. This position, along with the variable $B_{0f}$, is selected by the optimizer. (The extraction orbit proves to be the most critical in many designs and it also has the highest field values so it is often used as the fixed reference in these machine designs.) As discussed more fully below, not all of the field expansion coefficients set forth above are required in all of the machine designs—this just indicates the highest order used to date.

The properties of each individual cell may be described by seven constraint equations, discussed below, and twelve free parameters, also described below. The seven equations describe the reference trajectories and the "local" linear dynamics of beams at injection and extraction explicitly expressed in terms of the physical attributes of the magnetic components: their radial field profiles and lengths. The magnets have linear edge contours and the hard-edge model is implicitly assumed. The methods described herein use these equations, with appropriate modifications, extensions and additions to be discussed, for an initial optimization/parameter search to find potential parameters for desired designs.

(After doing so, the parameters derived from the hard edge model are inserted into a model with realistic edge magnetic fields and particles in a beam are tracked to verify the stability of the potential design.)

All parameters in these seven constraint equations can be expressed in terms of twelve variables described below and illustrated in FIGS. 1A and 1B, for the complete ring layout examples in FIGS. 2 and 3. In these equations, "e" and "i" denote extraction and injection, subscripts "f" and "d", horizontally focusing and defocusing magnets, and "f" the thin lens focal length. The twelve variables are:

| | | |
|---|---|---|
| 1. | $D_e$ | Drift distance between F and D magnets at extraction |
| 2.-5. | $L_{if}$, $L_{ef}$, $L_{id}$, $L_{ed}$ | F and D Magnet half-lengths at injection and extraction |
| 6.-9. | $B_{if}$, $B_{ef}$, $B_{id}$, $B_{ed}$ | F and D Magnet fields at injection and extraction |
| 10. | $\delta x_{if}$, | Distance from the injection orbit to the extraction orbit in the F magnet |
| 11.-12. | $\eta_f$, and $\eta_d$ | Linear edge angles for the F and D-magnets. |

The first four equations characterize horizontal and vertical tune requirements at injection and extraction. Thin-lens versions of the first four equations are presented below for purposes of demonstration. For the initial design and choice of parameters, however, they are replaced by the actual thick-lens equations to arrive at an initial design which has a stable tune; i.e. the first four equations are the traces of the thick-lens linear matrices representing a full cell which are the tunes across the cell. For a completely periodic lattice, the first four equations serve to specify the machine tune at injection and extraction (when multiplied by twice the number of cells). In the thin lens representation the focal length is related to the half cell tune by $$\sin(\phi/2)=L_{half}/f$$

where $L_{half}$ is the half-cell length and $\phi$ is the full cell phase advance. For example, for $\phi=90°$, $f=1.4\ L_{half}$ where $L_{half}$ is the sum of the two magnet half-lengths plus the intervening drift.) A negative $\rho$ reverses the sign of the edge crossing term in the vertical equation. The edge-angle convention here is opposite many conventional usages—in this work a larger wedge angle implies an increasing value of $\eta$.

As noted above, these seven constraint equations rely on the fact that the FFAGs here are completely periodic lattices where the base symmetry module is a half cell since there is reflection symmetry; i.e. the lattice is built from a half-cell plus a reflected half cell. The half-cell symmetry—center of F magnet to center of D magnet—represents a very powerful constraint in that all derivatives are required to be null at these points to enforce reflective symmetry and identical beginning and end optical functions for the full unit cell. With half cell symmetry, the null derivatives further imply that reference orbits must be parallel at these points. Periodicity and parallel reference orbits require that there be the same net bend per half cell.

This imposition of geometric closure of reference orbits is enforced in the fifth equation (set forth below), which relates the net bend per cell for injection and extraction trajectories.

The last two equations set forth below are also geometric in nature, linking magnetic lengths and drifts at injection to extraction through the sector angle, edge angle and alignment of the magnetic components, defining the physical linear edge and extent of the magnet. These equations govern the magnetic lengths at extraction and injection connected via the linear edge contour.

FIGS. 1A and 1B show the relation of the parameters in the seven equations to the F and D physical magnet design.

The first five equations are general. They are derived from linear dynamics. That is, they exclude the angle term in the dynamics of the particle Hamiltonian and also do not take into account the extent of the fringe fields. For the last two equations, particle dynamics is approximated by impulses given at the center of the magnets.

The system of equations using the thin-lens approximations set forth below may be solved for magnetic designs assuming the approximations mentioned above. However, as discussed above for the actual magnetic design the four thin-lens equations are not used, but rather the process involves using the traces of the corresponding thick lens linear matrices which represent the tune for the guide magnets under the same assumptions—neglecting the angle term in the Hamiltonian and extent of the fringe fields. If the design is not stable, further design iterations using the optimizer may take place until a satisfactory design is reached.

The seven equations are as follows, showing the four thin-lens equations for simplicity in demonstration rather than the thick-lens equations actually used. In the equations, f is the thin-lens focal length:

$$k_{if}L_{if}+\frac{\theta_{if}}{\rho_{if}}+\frac{((\theta_{ef}-\theta_{if})+\eta_{if})}{\rho_{if}}=\frac{1}{f_{if}}; \quad 1)$$

$$k_{id}L_{id}+\frac{\theta_{if}+\eta_{id}}{\rho_{id}}=\frac{1}{f_{id}}; \quad 2)$$

$$k_{ef}L_{ef}+\frac{\theta_{ef}}{\rho_{ef}}+\frac{\eta_{ef}}{\rho_{ef}}=\frac{1}{f_{ef}}; \quad 3)$$

$$k_{ed}L_{ed}+\frac{\theta_{ef}+\eta_{ed}}{\rho_{ed}}=\frac{1}{f_{ed}}; \quad 4)$$

$$\theta_{halfcell}=\theta_{if}+\theta_{id}=\theta_{ef}+\theta_{ed}; \quad 5)$$

$$L_{if}[\cos(\theta_{if})+\sin(\theta_{if})\tan(\theta_{ef}+\eta_{ef})]=L_{ef}\cos(\theta_{ef})-[\delta x_{if}-L_{ef}\sin(\theta_{ef})]\tan(\theta_{ef}+\eta_{ef}) \quad 6)$$

$$L_{ed}\cos(\theta_{ef})=L_{id}\cos(\theta_{if})+\delta x_{id}\sin(\theta_{id}+\theta_{if})+[\delta x_{if}+(L_{if}+D_i)\sin(\theta_{if})-(L_{ef}+D_e)\sin(\theta_{ef})]\tan(\eta_{ed}) \quad 7)$$

As discussed above, only the linear gradient case—a monotonic linear increase (or decrease) in field with distance from injection to extraction—was considered in the initial Johnstone work on non-scaling accelerators referenced above. That case requires five technical choices of parameters to fully solve these seven equations with twelve parameters; generally, the five may be chosen to be the distance between extraction and injection in the F-magnet, the drift length between the magnets at extraction, and 3 injection/extraction fields between the F-magnet and D-magnet combined-function magnets. With only linear gradients involved, the solutions are wedge-shaped, off-center quadrupoles.

However, when the initial design solutions obtained in the above manner are tested for tune stability, as discussed above, it is found that very compact, stable orbits cannot be achieved using this linear-field non-scaling approach for acceleration from 50 keV to the energy range 3 to 9 MeV, within the compact size framework described above (20 to 44 cm radii). Furthermore, modifying the seven equations described above to accommodate curved rather than linear magnetic field boundaries also fails to produce practical magnetic component and lattice designs over the full acceleration range from 50 keV to either 3 or 9 MeV.

Rather, studies show that relaxing the linear field gradient constraint and including higher field components in the non-scaling framework permits achieving compact designs with practical magnet technologies, for acceleration ranges of the magnitude set forth above where the linear field gradient solution fails. In these studies the linear radial field profile was replaced with a high-order field expansion in the trajectory and dynamical equations.

Dynamical equations at intermediate energies—identical to those implemented at injection and extraction—could be added to allow for the additional degrees of freedom introduced by the nonlinear field components, but finding exact solutions with such nonlinear equations is impractical at best.

Instead, practical starting solutions were discovered using native optimizers within Mathematica® to explore the "local" parameter space. In this approach, technically infeasible designs are eliminated by setting limits on the search parameters to exclude nonphysical magnet lengths and unachievable field strengths. In particular, magnet lengths less than 0.01 m were excluded internally in the optimizer search and absolute field strengths greater than 5 kG were not considered, as this represents the effective permanent magnet field limit. Other parameters, such as the magnet spacing at the extraction energy, were chosen based upon technical considerations, namely cross-talk problems between the magnets and the need to accommodate coils, flanges, and vacuum connections. In particular, the minimum magnet spacing at the extraction energy was set to 0.05 m in the designs described herein, since this is considered to be the smallest feasible magnet spacing, or drift, considering both the technical considerations listed above and conventional extraction of the beam. For significantly higher energies, or acceleration of heavier particles, this drift will increase, and, in the latter case, the increase can be an order of magnitude or more. Drifts at injection and intermediate energies were constrained to be larger than at least 0.01 m for the same technical reasons. The optimizer techniques used are particularly powerful as the number of constraint equations used can be more or less than the number of search parameters (which is not feasible when solving for an exact solution of the equations).

Once optimizers were implemented in the design process, additional machine-specific design criteria were added to further narrow the solution set. These included constraints on the average radii at extraction and injection energies:

$$\text{Inj Radius}=\text{Radi}=\text{NSector Lihalf}/\pi \tag{8}$$

$$\text{Ext Radius}=\text{Rade}=\text{NSector Lehalf}/\pi \tag{9}$$

These equations for injection and extraction radius, which were sufficient when combined with the other constraints discussed herein to permit solutions to be obtained in the linear field gradient case, were insufficient for the non-linear gradient designs disclosed herein; as discussed further below, the radius for an additional energy was required to be specified for the nonlinear 3, 3.5, 4, and 9-MeV designs.

In addition, a constraint was added in the bend per cell at injection to reflect the requirement that there be an integer number of magnet sectors. (This automatically extends to extraction because the bend at injection is required to be equal to the bend at extraction in the original seven global constraint equations).

$$\frac{\pi}{NSector} = \theta_{id} + \theta_{if} \tag{10}$$

The number of sectors, constrained to be an integer via the bend/cell constraint, was an important search parameter in the optimization process. Typically, it was allowed to vary between 6 and 11. For solutions of approximately 3-MeV extraction energy, the optimal solution tended to be 8 cells, while for higher energies such as 9 MeV the number increased to 9. Increasing the number of orbits within a fixed radial extent generally tends to require a higher number of sectors to reduce beam excursion.

Subordinate equations were also included in the optimizer equation list. The subordinate equations reflect the fact that the aperture in the D magnet and the drift at injection can be derived in terms of the basic parameters as defined in the seven primary equations from simple geometric considerations (bend angles and lengths at injection and extraction and the magnet edge angles). These secondary, subordinate equations (set forth below) describe the dependent variables $D_i$ and $\delta x_{id}$ in terms of the independent variables given above, and are the injection drift and orbit excursion in the D quadrupole between injection and extraction, respectively.

$$\delta x_{id}\cos(\theta_{id}+\theta_{if})=\delta x_{if}+\text{Lihalf}\sin(\theta_{if})-\text{Lehalf}\sin(\theta_{ef}) \tag{11}$$

$$D_i[\cos(\theta_{if})-\sin(\theta_{if})\tan(\eta_{ed})]=(L_{ef}+D_e)\cos(\theta_{ef})-L_{if}\cos(\theta_{if})+[\delta x_{if}+L_{if}\sin(\theta_{if})-(L_{ef}+D_e)\sin(\theta_{ef})]\tan(\eta_{ed}) \tag{12}$$

As stated above, once the linear field gradient constraint was relaxed, it was not possible to derive accelerator designs by fixing only the energies at injection and extraction; rather, three energies—injection, extraction and an intermediate energy—were found empirically to be optimal for design for these non-scaling accelerators. Additional intermediate energies, beyond one, although considered, served only to overload and inhibit optimizer convergence in the highly nonlinear designs considered here. (Although the optimizer was sensitive to the intermediate energy choice and yielded the designs disclosed herein when the energy was chosen to be close to the injection energy, at 356 keV, other intermediate values can also be used in this design method.)

In total, twenty equations were eventually utilized in the optimizer least squares merit function to describe the injection energy, the extraction energy, and the intermediate energy. These twenty final equations include the twelve equations listed above and eight additional equations relating to the intermediate energy specified:

$$k_{3f}L_{3f} + \frac{\theta_{3f}}{\rho_{3f}} + \frac{((\theta_{ef}-\theta_{3f})+\eta_{if})}{\rho_{3f}} = \frac{1}{f_{3f}}; \tag{13}$$

$$k_{3d}L_{3d} + \frac{\theta_{3f}+\eta_{3d}}{\rho_{3d}} = \frac{1}{f_{3d}}; \tag{14}$$

$$\theta_{halfcell} = \theta_{if} + \theta_{id} = \theta_{3f} + \theta_{3d} \tag{15}$$

$$L_{3f}[\cos(\theta_{3f})+\sin(\theta_{3f})\tan(\theta_{ef}+\eta_{ef})] = L_{ef}\cos(\theta_{ef}) - [\delta x_{3f} - L_{ef}\sin(\theta_{ef})]\tan(\theta_{ef}+\eta_{ef}); \tag{16}$$

$$L_{ed}\cos(\theta_{ef}) = L_{3d}\cos(\theta_{3f}) + \delta x_{3d}\sin(\theta_{3d}+\theta_{3f}) + [\delta x_{3f} + (L_{3f}+D_3)\sin(\theta_{3if}) - (L_{ef}+D_e)\sin(\theta_{ef})]\tan(\eta_{ed}) \tag{17}$$

$$\delta x_{3d}\cos(\theta_{3d}+\theta_{3f}) = \delta x_{3f} + L3half\sin(\theta_{3f}) - Lehalf\sin(\theta_{ef}) \tag{18}$$

-continued $$D_3[\cos(\theta_{3f}) - \sin(\theta_{3f})\tan(\eta_{ed})] = (L_{ef} + D_e)\cos(\theta_{ef}) - L_{3f}\cos(\theta_{3f}) + [\delta x_{3f} + L_{3f}\sin(\theta_{3f}) - (L_{ef} + D_e)\sin(\theta_{ef})]\tan(\eta_{ed}) \quad 19)$$

$$Rad3 = Nsector\ L3half/\pi \quad 20)$$

These twenty equations include:

a) 6 horizontal and vertical tune constraints at the three energies (Eq. 1-4 and 13-14);

b) 2 equations requiring equality in the bend/cell for all energies (Eq. 5 and 15);

c) 4 equations connecting the magnet lengths between energies through the linear magnet edge contour (Eq. 6-7 and 16-17);

d) 1 constraint requiring that the total number of cells have an integer value (Eq. 10);

e) 3 equations governing the desired average orbit radius at the three energies (Eq. 8-9 and 20);

f) 2 subordinate equations for the drift at energies less than the extraction energy (However, the drift at extraction is fixed at 5 cm to allow physical space for extraction (Eq. 11 and 18); and g) 2 subordinate equations for the excursion of the orbit relative to the extraction orbit in the D magnet (Eq. 12 and 19).

The optimizer is extremely sensitive to the parameter setup and limits. However, once an approximate solution is found with a merit function that is sufficiently small a machine is fully described. Using these parameters the exact orbits at all momenta can be calculated and the tunes can be checked for stability over the entire range. If the tunes are not sufficiently stable as a function of energy the optimizer must be adjusted and another search performed.

3-MeV Machine Design

A 50 keV to 3 MeV (kinetic energy) compact accelerator design was accomplished within a 20 to 42 cm average radius, injection to extraction, using the design approach described and Mathematica® for the optimization search.

For the 3 MeV design, as noted, three field points, injection (50 keV kinetic energy), extraction (3 MeV) and an intermediate energy (356 keV), were used in the optimization. Since the coefficients describing a field expansion can be found exactly if the number of field points is equal to the order of the field plus 1, the three field points were sufficient to determine coefficients up to sextupole explicitly, and this was carried out. In this design, it was found that the sextupole field (without higher order multipole components) was sufficient to contain the tune variation and permit beam stability. For this specific electron machine design, therefore, the optimization search included three fields: injection, extraction, and an intermediate energy, with limits implemented as to acceptable field values. The radial field expansion coefficients up to the sextupole field were derived in terms of these three fields.

The following were the equations used to solve for coefficients of the field expansion in terms of the individual field points.

$$B_f = B_{0f} + a_f\delta x + b_f\delta x^2$$

$$b_f = \frac{(B_{ef} - B_{if})\delta x_{3f} - (B_{ef} - B_{3f})\delta x_{if}}{\delta x_{if}\delta x_{3f}(\delta x_{3f} - \delta x_{if})}$$

$$a_f = \frac{[(B_{ef} - B_{3f}) + b_f(-2\delta x_{ef}\delta x_{3f} + \delta x_{3f}^2)]}{\delta x_{3f}}$$

$$B_{0f} = B_{ef} - a_f\delta x_{ef} - b_f\delta x_{ef}^2$$

General parameters of the 20-42 cm 3-MeV machine are set forth in Table 1. As indicated, tune stabilization was accomplished with only a $2^{nd}$ order field expansion:

$$F\text{ magnet: } B(r)=0.14-2.37r+10.44r^2$$

and $$D\text{ magnet: } B(r)=0.07-1.15r-0.83r^2$$

with all fields given in units of kG and r in cm. In this notation, the radius parameter, r, is referenced to the center of the machine. The zero-field point in the radial profile is outside the physical magnet and does not correspond to the "intersection" of the edge contours as in a conventional radial-sector FFAG.

TABLE 1

General Parameters of the 3 MeV non-scaling FFAG, linear gradient plus sextupole field profile.

| Parameter | Unit | Injection | Extraction |
|---|---|---|---|
| Energy Range | MeV | 0.050 | 3.0 |
| Tune/cell ($\nu_x/\nu_y$) | 2π-rad | 0.260/0.253 | 0.263/0.263 |
| Average Radius | m | 0.198 | 0.417 |
| Number of cells | | 8 | |
| Straight section length (drift length) | m | 0.029 | 0.052 |
| Peak Field | kG | | |
| F | | 0.088 | 1.002 |
| D | | −0.177 | −0.491 |
| Magnet Lengths | m | | |
| F | | 0.0877 | 0.1348 |
| D | | 0.0094 | 0.0976 |
| Apertures | m | | |
| F | | 0.218 | |
| D | | 0.179 | |

In contrast, a linear field gradient would give an optimized field profile of $$F\text{ magnet: } B(r)=-0.77+4.81r$$

and $$D\text{ magnet: } B(r)=0.26-1.39r$$

where the constant term is actually the field at injection. As discussed, the tune for such a linear field gradient design is much less stable, $\Delta\nu_x$=0.094 and $\Delta\nu_y$=0.067 over the acceleration range, than in the design with the nonlinear sextupole term, where $\Delta\nu_x$=0.009 and $\Delta\nu_y$=0.02 (note these are hard-edge Mathematica® results).

4 MeV and 3.5 MeV Ultra-Compact Machine Designs

The inner radius of the 3 MeV machine can be made smaller within the induction concept because the induction core can be reduced and still achieve the flux change required for 3 MeV. As explained earlier, the duty cycle will be concomitantly affected. To illustrate this point, a machine of 4 MeV was designed, resulting in the design in Table 2. The 4 MeV design achieves an average injection orbit radius of 16.2 cm and an extraction radius of 35 cm. The intermediate point used for the design optimization remained 0.7 MeV/c (356 keV).

Further reduction in size was achieved with a 3.5 MeV kinetic energy machine, to average radii for injection and extraction respectively of approximately 10 cm and 27 cm, which shows how efficient this approach is in achieving ultra-compact machine designs. The 3.5 MeV design is shown in Table 3.

To achieve this further compactness and tune stability required field orders higher than the sextupole field used in the 42 cm, 3-MeV machine described above. (That is, use of a sextupole field expansion did not yield a design which demonstrated satisfactory beam stability.) To carry this out, the fields in the dynamical equations are described in terms of a Taylor expansion, with the coefficients of the Taylor expansion added to the optimizer parameter search array. Convergence of the optimization using the Taylor expansion is considered successful when a stable tune is produced over the entire acceleration range.

The successful field expansions for these respective machines are as follows. The 4 MeV design required an F magnet field of:

$$B(r)=-0.045-0.17r^2+26.35r^3$$

and the D magnet field is given by $$B(r)=0.40-20.74r^2+9.71r^3.$$

The ultra-compact 3.5 MeV design required an F magnet field of:

$$B(r)=0.20+36.52r^2-52.53r^3$$

and the D magnet field is given by $$B(r)=-0.09+2.03r-12.97r^2+14.11r^3.$$

Interestingly, the field content of the ultra-compact 3.5 MeV machine does not reduce to the same orders in the F and D magnets, and is different from the larger-radius 4-MeV version.

It should be noted that direct extension to octupole, or a third-order field expansion, in the optimization technique, by adding a further set of equations for an additional intermediate energy, greatly complicated coefficient derivation, requiring four field specifications at four energies. This increase in the number of constraint equations (to 28) and enhancement of parameter space was found not to be tractable by the optimizer, generating either unusable solutions or non-convergence. Therefore, the higher energy and more compact designs discussed here, which required multipoles higher than sextupole, were defined as described above in the optimizer in terms of field expansion coefficients.

TABLE 2

General parameters of the 4 MeV non-scaling FFAG design

| Parameter | Unit | Injection | Extraction |
|---|---|---|---|
| Energy Range | MeV | 0.050 | 4 |
| Tune/cell ($\nu_x/\nu_y$) | 2π-rad | 0.224/0.164 | 0.231/0.210 |
| Average Radius | m | 0.162 | 0.350 |
| No. cells | | 8 | |
| Straight section length (drift length) | m | 0.010 | 0.050 |
| Peak Field | kG | | |
| F | | 0.082 | 1.105 |
| D | | −0.110 | −1.488 |
| Magnet Lengths | m | | |
| F | | 0.0949 | 0.1458 |
| D | | 0.0134 | 0.0294 |
| Apertures | m | | |
| F | | 0.190 | |
| D | | 0.162 | |

TABLE 3

General parameters of the ultra compact 3.5 MeV non-scaling FFAG design

| Parameter | Unit | Injection | Extraction |
|---|---|---|---|
| Energy Range (kinetic energy) | MeV | 0.050 | 3.5 |
| Tune/cell ($\nu_x/\nu_y$) | 2π-rad | 0.275/0.259 | 0.209/0.190 |
| Average Radius | m | 0.104 | 0.274 |
| No. cells | | 8 | |
| Straight section length (drift length) | m | 0.016 | 0.047 |
| Peak Field | kG | | |
| F | | 0.500 | 2.034 |
| D | | −0.000 | −0.209 |
| Magnet Lengths | m | | |
| F | | 0.0112 | 0.061 |
| D | | 0.0390 | 0.0598 |
| Apertures | m | | |
| F | | 0.190 | |
| D | | 0.161 | |

9-MeV Machine Design

As noted above, for energies above the 3 MeV design, field components above the sextupole were required to obtain beam stability, and hence in addition to using three field points (injection, extraction and an intermediate energy of 356 keV) to define equations for the optimization, radial field expansion coefficients needed to be subsequently derived from the results of the optimizer search. This approach was also used for the 9-MeV design, but the 9-MeV machine proved more challenging and the order of the field expansion used by the optimizer increased rapidly; i.e. the field had to rise more rapidly via a higher-order Taylor expansion to confine the outer orbits, with their increased energy, to within the required (average) 44-cm radius. (It was not feasible, as discussed above, to use multiple specific field points and so the expansion coefficients were fit directly in the optimizer implementation used for the 9-MeV machine design.)

The difficulty in the 9 MeV and other higher energy cases arose from the increasing complexity of the higher-order derivations for coefficients in terms of field values. Even the derivation for coefficients up to only octupole, which requires 4 field points, rapidly expanded into very lengthy equations, particularly for the $r^3$ term. The field expansion itself proved more tractable for the optimizer. Thus, the higher energy procedure is essentially the inverse of the procedure used in the 3 MeV designs: instead of fitting specific field values for specific different energies, which then are used to determine a unique set of coefficients for the field expansion, the individual coefficients of the Taylor field expansion were optimized. The specific coefficient solutions, if the optimizer search was successful, then generated field profiles associated with orbits that fulfilled all the criteria (at the three energies) such as the desired extraction radius. (Limits can still be set on the field values generated from the expansion and the radii of the orbits in the optimizer setup.)

Although the field expansion found by the optimizer was very high for tune stabilization (using an $r^6$ term), it was discovered that a strong cancellation exists in the fields between the quadrupole (linear) term and terms higher than octupole. As a result, these machines are the first known accelerators to initiate strong focusing starting with sextupole fields. Also notably, the field expansion truncates effectively at the octupole term and inclusion of complex higher-order fields is not required.

The F magnet field may be written as $$B(r)=0.11-8.67r^2+41.93r^3$$

and the D magnet field is given by $$B(r)=-0.03-1.26r^2-54.67r^3.$$

Since the 9 MeV accelerator is a 9-cell ring as compared with the 8 cell rings at lower energies, the ring layout is shown in FIG. 3. Again the number of sectors is one of the search parameters and generally increases as a larger and larger energy range is required within the same magnet aperture.

TABLE 4

General parameters of the 9 MeV non-scaling FFAG design

| Parameter | Unit | Injection | Extraction |
|---|---|---|---|
| Energy Range (kinetic) | MeV | 0.050 | 9. |
| Tune/cell ($\nu_x/\nu_y$) | 2π-rad | 0.233/0.236 | 0.241/0.227 |
| Average Radius | m | 0.206 | 0.437 |
| No. cells | | 9 | |
| Straight section length (drift length) | m | 0.028 | 0.050 |
| Peak Field | kG | | |
| F | | 0.114 | 1.986 |
| D | | −0.107 | −2.811 |
| Magnet Lengths | m | | |
| F | | 0.0670 | 0.1650 |
| D | | 0.208 | 0.0398 |
| Apertures | m | | |
| F | | 0.230 | |
| D | | 0.199 | |

While the systems and methods disclosed herein have been particularly shown and described with references to exemplary embodiments thereof, they are not so limited and it will be understood by those skilled in the art that various changes in form and details may be made therein without departing from the scope of the disclosure. It should be realized this invention is also capable of a wide variety of further and other embodiments within the scope of the invention. Those skilled in the art will recognize or be able to ascertain using no more than routine experimentation, many equivalents to the exemplary embodiments described specifically herein. Such equivalents are intended to be encompassed in the scope of the present disclosure.

The invention claimed is:

1. A non-scaling fixed field alternating-gradient electron accelerator, comprising a) an induction core; and b) a plurality of substantially-identical cells, each cell comprising a focus (F) magnet (an F-magnet) configured to focus an electron beam horizontally and defocus said beam vertically and a defocus (D) magnet (D-magnet) configured to defocus said beam horizontally and focus said beam vertically, wherein said cells are arranged in a ring such that the F- and D-magnets alternate, and such that the electron beam circulates in said ring and is stable after being injected and until being extracted;

wherein the cells are symmetrically arranged; and wherein the F-magnets and D-magnets have linear edges; and wherein the F-magnets and D-magnets are configured to generate a guide magnetic field which varies non-linearly with radius and to determine reference orbits which close geometrically, wherein:

a beam energy is about 0.05 MeV at injection and about 3 MeV at extraction, an average radius is about 0.198 m. at injection and about 0.417 m at extraction, a peak field in the F-magnets is about 0.088 kG at injection and about 1.002 kG at extraction, a peak field in the D-magnets is about −0.177 kG at injection and about −0.491 kG at extraction, a magnet length for the F-magnets is about 0.0877 m at injection and about 0.1348 m at extraction, a magnet length for the D-magnets is about 0.0094 m. at injection and about 0.0976 at extraction, an aperture in the F-magnet is about 0.218 m, an aperture in the D-magnets is about 0.179 m, there are 8 cells, and a sextupole field is sufficient to contain tune variation and permit beam stability.

2. A non-scaling fixed field alternating-gradient electron accelerator, comprising a) an induction core; and b) a plurality of substantially-identical cells, each cell comprising a focus (F) magnet (an F-magnet) configured to focus an electron beam horizontally and defocus said beam vertically and a defocus (D) magnet (D-magnet) configured to defocus said beam horizontally and focus said beam vertically, wherein said cells are arranged in a ring such that the F- and D-magnets alternate, and such that the electron beam circulates in said ring and is stable after being injected and until being extracted;

wherein the cells are symmetrically arranged; and wherein the F-magnets and D-magnets have linear edges; and wherein the F-magnets and D-magnets are configured to generate a guide magnetic field which varies non-linearly with radius and to determine reference orbits which close geometrically, wherein:

a beam energy is about 0.05 MeV at injection and about 4 MeV at extraction, an average radius is about 0.162 m. at injection and about 0.350 m at extraction, a peak field in the F-magnets is about 0.082 kG at injection and about 1.105 kG at extraction, a peak field in the D-magnets is about −0.110 kG at injection and about −1.488 kG at extraction, a magnet length for the F-magnets is about 0.0949 m at injection and about 0.1458 m at extraction, a magnet length for the D-magnets is about 0.0134 m. at injection and about 0.0294 at extraction, an aperture in the F-magnet is about 0.190 m, an aperture in the D-magnets is about 0.162 m, and there are 8 cells.

3. A non-scaling fixed field alternating-gradient electron accelerator, comprising a) an induction core; and b) a plurality of substantially-identical cells, each cell comprising a focus (F) magnet (an F-magnet) configured to focus an electron beam horizontally and defocus said beam vertically and a defocus (D) magnet (D-magnet) configured to defocus said beam horizontally and focus said beam vertically, wherein said cells are arranged in a ring such that the F- and D-magnets alternate, and such that the electron beam circulates in said ring and is stable after being injected and until being extracted;

wherein the cells are symmetrically arranged; and wherein the F-magnets and D-magnets have linear edges; and wherein the F-magnets and D-magnets are configured to generate a guide magnetic field which varies non-linearly with radius and to determine reference orbits which close geometrically, wherein:

a beam energy is about 0.05 MeV at injection and about 3.5 MeV at extraction, an average radius is about 0.104 m. at injection and about 0.274 m at extraction, a peak field in the F-magnets is about 0.500 kG at injection and about 2.034 kG at extraction, a peak field in the D-magnets is about −0.000 kG at injection and about −0.209 kG at extraction, a magnet length for the F-magnets is about 0.0112 m at injection and about 0.061 m at extraction, a magnet length for the D-magnets is about 0.0390 m. at injection and about 0.0598 at extraction, an aperture in the F-magnet is about 0.190 m, an aperture in the D-magnets is about 0.161 m, and there are 8 cells.

4. A non-scaling fixed field alternating-gradient electron accelerator, comprising a) an induction core; and b) a plurality of substantially-identical cells, each cell comprising a focus (F) magnet (an F-magnet) configured to focus an electron beam horizontally and defocus said beam vertically and a defocus (D) magnet (D-magnet) configured to defocus said beam horizontally and focus said beam vertically, wherein said cells are arranged in a ring such that the F- and D-magnets alternate, and such that the electron beam circulates in said ring and is stable after being injected and until being extracted;

wherein the cells are symmetrically arranged; and wherein the F-magnets and D-magnets have linear edges; and wherein the F-magnets and D-magnets are configured to generate a guide magnetic field which varies non-linearly with radius and to determine reference orbits which close geometrically, wherein a beam energy is about 0.05 MeV at injection and about 9 MeV at extraction, an average radius is about 0.206 m. at injection and about 0.437 m at extraction, a peak field in the F-magnets is about 0.114 kG at injection and about 1.986 kG at extraction, a peak field in the D-magnets is about −0.107 kG at injection and about −2.811 kG at extraction, a magnet length for the F-magnets is about 0.0670 m at injection and about 0.1650 m at extraction, a magnet length for the D-magnets is about 0.0208 m. at injection and about 0.0398 at extraction, an aperture in the F-magnet is about 0.230 m, an aperture in the D-magnets is about 0.199 m, and there are 9 cells.

* * * * *